(12) United States Patent
Xia et al.

(10) Patent No.: US 10,627,172 B2
(45) Date of Patent: Apr. 21, 2020

(54) HEAT DISSIPATION APPARATUS

(71) Applicant: Huawei Technologies Co., Ltd., Shenzhen (CN)

(72) Inventors: Zaizhong Xia, Shanghai (CN); Shuainan Lin, Shenzhen (CN); Yuening Li, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/651,873

(22) Filed: Jul. 17, 2017

(65) Prior Publication Data
US 2017/0314877 A1 Nov. 2, 2017

Related U.S. Application Data

(63) Continuation of application No. PCT/CN2015/082937, filed on Jun. 30, 2015.

(30) Foreign Application Priority Data

Jan. 15, 2015 (CN) .......................... 2015 1 0023016

(51) Int. Cl.
*F28F 13/08* (2006.01)
*H05K 7/20* (2006.01)
(Continued)

(52) U.S. Cl.
CPC ................ *F28F 13/08* (2013.01); *F28F 3/02* (2013.01); *F28F 13/06* (2013.01); *H01L 23/467* (2013.01);
(Continued)

(58) Field of Classification Search
CPC .......... F28F 13/08; F28F 2215/04; F28F 3/02; H01L 23/467
See application file for complete search history.

(56) References Cited

U.S. PATENT DOCUMENTS 5,927,385 A * 7/1999 Yeh ........................ H01L 23/467
165/121
5,957,194 A * 9/1999 Azar ........................ F28F 3/02
165/185
(Continued)

FOREIGN PATENT DOCUMENTS

CN 2671302 Y 1/2005
CN 102213855 A 10/2011
(Continued)

OTHER PUBLICATIONS

Foreign Communication From a Counterpart Application, European Application No. 15677563.5, Extended European Search Report dated Dec. 15, 2017, 8 pages.
(Continued)

*Primary Examiner* — Keith M Raymond
*Assistant Examiner* — Gordon A Jones
(74) *Attorney, Agent, or Firm* — Conley Rose, P.C.

(57) ABSTRACT

A heat dissipation apparatus, including a base plate, a guide fin group, and a heat dissipation fin group, where the guide fin group is formed on a surface of the base plate, the guide fin group is disposed with at least two guide fins that are disposed at an interval, and the at least two guide fins extend along a surface of the base plate from an edge of the base plate, and a flow path for flowing of an airflow is formed between two adjacent guide fins, and the heat dissipation fin group includes at least one heat dissipation fin, where the at least one heat dissipation fin is fixedly connected to the top of the at least two guide fins to dissipate heat of the at least two guide fins. The heat dissipation apparatus further includes, guide fins and a stopper fin.

18 Claims, 4 Drawing Sheets

(51) Int. Cl.
  *H01L 23/467* (2006.01)
  *F28F 3/02* (2006.01)
  *F28F 13/06* (2006.01)
(52) U.S. Cl.
  CPC ............ *H05K 7/20* (2013.01); *F28F 2215/04* (2013.01); *H05K 7/2039* (2013.01)

(56) References Cited

U.S. PATENT DOCUMENTS

| | | | | |
|---|---|---|---|---|
| 6,125,921 | A * | 10/2000 | Kuo | H01L 23/3672 |
| | | | | 165/185 |
| 6,170,563 | B1 * | 1/2001 | Hsieh | F28F 3/04 |
| | | | | 165/122 |
| 6,498,395 | B2 * | 12/2002 | Baek | H01L 23/467 |
| | | | | 257/706 |
| 6,615,909 | B2 * | 9/2003 | Fast | H01L 23/3672 |
| | | | | 165/185 |
| 6,622,786 | B1 * | 9/2003 | Calmidi | F28F 3/022 |
| | | | | 165/122 |
| 6,964,295 | B1 | 11/2005 | Yu et al. | |
| 7,331,380 | B2 * | 2/2008 | Ghosh | H01L 23/473 |
| | | | | 165/104.33 |
| 7,539,017 | B2 * | 5/2009 | Chang | H01L 23/3677 |
| | | | | 361/703 |
| 2001/0003304 | A1 | 6/2001 | Azar | |
| 2003/0141040 | A1 | 7/2003 | Lee et al. | |
| 2003/0188849 | A1 | 10/2003 | Gawve | |
| 2004/0037036 | A1 | 2/2004 | Suzuki | |
| 2005/0021784 | A1 | 1/2005 | Prehofer | |
| 2006/0002087 | A1 * | 1/2006 | Bezama | F28F 3/12 |
| | | | | 361/699 |
| 2006/0215364 | A1 | 9/2006 | Le | |
| 2011/0249444 | A1 | 10/2011 | Hayashi | |
| 2013/0031895 | A1 * | 2/2013 | Glaser | F28F 3/02 |
| | | | | 60/320 |
| 2016/0081225 | A1 * | 3/2016 | Taketomi | F28F 3/02 |
| | | | | 165/80.3 |
| 2018/0092247 | A1 * | 3/2018 | Chiu | F28F 3/086 |

FOREIGN PATENT DOCUMENTS

| | | |
|---|---|---|
| CN | 102916601 A | 2/2013 |
| CN | 104602490 A | 5/2015 |
| JP | H07254794 A | 10/1995 |
| JP | H107254794 A | 10/1995 |
| JP | 2003249611 A | 9/2003 |

OTHER PUBLICATIONS

Machine Translation and Abstract of Chinese Publication No. CN2003249611, Sep. 5, 2003, 11 pages.
Machine Translation and Abstract of Chinese Publication No. CN2671302, Jan. 12, 2005, 6 pages.
Machine Translation and Abstract of Chinese Publication No. CN102916601, Feb. 6, 2013, 5 pages.
Machine Translation and Abstract of Chinese Publication No. CN104602490, May 6, 2015, 9 pages.
Machine Translation and Abstract of Japanese Publication No. JP2003249611, Sep. 5, 2003, 11 pages.
Machine Translation and Abstract of Japanese Publication No. JPH07254794, Oct. 3, 1995, 13 pages.
Foreign Communication From a Counterpart Application, PCT Application No. PCT/CN2015/082937, English Translation of International Search Report dated Sep. 6, 2015, 3 pages.
Foreign Communication From a Counterpart Application, PCT Application No. PCT/CN2015/082937, English Translation of Written Opinion dated Sep. 6, 2015, 6 pages.

* cited by examiner

HEAT DISSIPATION APPARATUS

CROSS-REFERENCE TO RELATED APPLICATIONS

This application is a continuation of International Patent Application No. PCT/CN2015/082937 filed on Jun. 30, 2015, which claims priority to Chinese Patent Application No. 201510023016.9 filed on Jan. 15, 2015. The disclosures of the aforementioned applications are hereby incorporated by reference in their entireties.

TECHNICAL FIELD

The present disclosure relates to the communications field, and in particular, to a heat dissipation apparatus.

BACKGROUND

In some approaches, a heat dissipation module is generally disposed for an electronic device that emits a large amount of heat, to help dissipate heat of the electronic device and ensure normal operation of the electronic device. At present, there is a type of electronic device, such as a projector or an indoor surveillance camera, that needs to be suspended from an indoor ceiling for use. As shown in FIG. 1, a heat dissipation apparatus is provided to dissipate heat for this type of electronic device 10. The heat dissipation apparatus includes a base plate 11 and flaky heat dissipation fins 13 that protrude against the base plate 11. The heat dissipation apparatus is suspended from a ceiling 100 and is disposed apart from the ceiling 100. The heat dissipation fins 13 of the heat dissipation apparatus are disposed toward the ceiling 100. The electronic device 10 is fixedly disposed on a side of the base plate 11 facing away from the heat dissipation fin 13.

However, because the heat dissipation apparatus is disposed near the ceiling 100, a fin height of the heat dissipation fins 13 of the heat dissipation apparatus is limited. As a result, a heat dissipation effect of the heat dissipation fins 13 is limited.

SUMMARY

A heat dissipation apparatus with a good heat exchange capability and a good heat dissipation effect is provided.

According to a first aspect, a heat dissipation apparatus is provided, including a base plate, a guide fin group, and a heat dissipation fin group, where the guide fin group is formed on a surface of the base plate, the guide fin group is disposed with at least two guide fins that are disposed at an interval, and the guide fins extend along the surface of the base plate from an edge of the base plate, and a flow path for flowing of an airflow is formed between two adjacent guide fins, and the heat dissipation fin group includes at least one heat dissipation fin, where the heat dissipation fin is fixedly connected to the top of the guide fins to dissipate heat of the guide fins.

In a first possible implementation manner of the first aspect, the heat dissipation apparatus is further disposed with a stopper fin, where the stopper fin is disposed at the center of the base plate and is enclosed to form an enclosure, and the guide fins are disposed outside the stopper fin and extend toward the stopper fin from the edge of the base plate.

With reference to the first possible implementation manner of the first aspect, in a second possible implementation manner, the heat dissipation apparatus is further disposed with a heat dissipation tooth, where the heat dissipation tooth is disposed inside the stopper fin and configured to enhance a heat dissipation effect of a region enclosed by the stopper fin.

With reference to the first possible implementation manner of the first aspect, in a third possible implementation manner of the first aspect, the heat dissipation apparatus is further disposed with a heat dissipation strip, where the heat dissipation strip is embedded in side edges, disposed near the edge of the base plate, of the guide fins to dissipate heat from the side edges of the guide fins.

With reference to the first possible implementation manner of the first aspect, in a fourth possible implementation manner, a quantity of guide fin groups disposed for the heat dissipation apparatus is at least one, and there are at least two or more than two guide fins in each guide fin group that extend from the edge of the base plate and press against the stopper fin.

With reference to the fourth possible implementation manner of the first aspect, in a fifth possible implementation manner, a quantity of guide fin groups disposed for the heat dissipation apparatus is two or more than two, and the guide fin groups are evenly distributed outside the stopper fin and form independent guide regions respectively.

With reference to the first aspect or the first possible implementation manner of the first aspect to the fifth possible implementation manner of the first aspect, in a sixth possible implementation manner, a quantity of heat dissipation fin groups disposed for the heat dissipation apparatus corresponding to each guide fin group is at least two, and all heat dissipation fin groups disposed for a same guide fin group are sequentially arranged in an extension direction of the guide fins of the guide fin group.

With reference to the sixth possible implementation manner of the first aspect, in a seventh possible implementation manner, in the heat dissipation fin groups disposed for a same guide fin group, a gap between the base plate and heat dissipation fins in a heat dissipation fin group that is disposed relatively near the edge of the base plate is greater than a gap between the base plate and heat dissipation fins in a heat dissipation fin group that is disposed relatively near the center of the base plate.

According to a second aspect, a heat dissipation apparatus is provided, including a base plate, a guide fin group, and a cover, where the guide fin group is formed on a surface of the base plate, the guide fin group is disposed with at least two guide fins that are disposed at an interval, and the guide fins extend along the surface of the base plate from an edge of the base plate, and a flow path for flowing of an airflow is formed between two adjacent guide fins, and the cover is fixedly connected to the top of the guide fins to dissipate heat of the guide fins.

In a first possible implementation manner of the second aspect, the cover is disposed with a through hole.

According to the heat dissipation apparatus of the present disclosure, guide fins and a stopper fin are disposed in order to control an airflow direction when air flows, and further to prevent air with a relatively high temperature from accumulating in a central position of a base plate. In addition, a heat dissipation tooth is disposed at the center of the base plate to improve an overall heat dissipation effect of the heat dissipation apparatus.

BRIEF DESCRIPTION OF DRAWINGS

To describe the technical solutions in the embodiments of the present disclosure more clearly, the following briefly describes the accompanying drawings required for describing the embodiments. The accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. The described embodiments are merely some but not all of the embodiments of the present disclosure. All other embodiments obtained by a person of ordinary skill in the art based on the embodiments of the present disclosure without creative efforts shall fall within the protection scope of the present disclosure.

Figure 1:
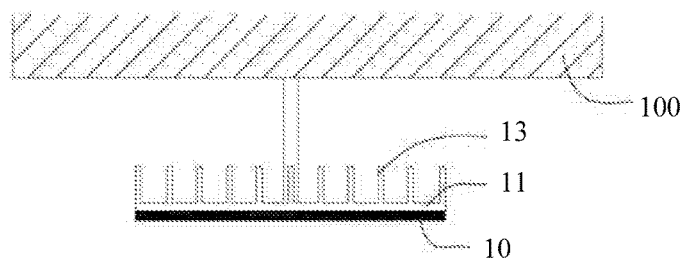
FIG. 1 is a schematic structural diagram of a heat dissipation apparatus.
Figure 2:
FIG. 2 is a schematic structural diagram of a heat dissipation apparatus according to Embodiment 1 of the present disclosure.
Figure 2:
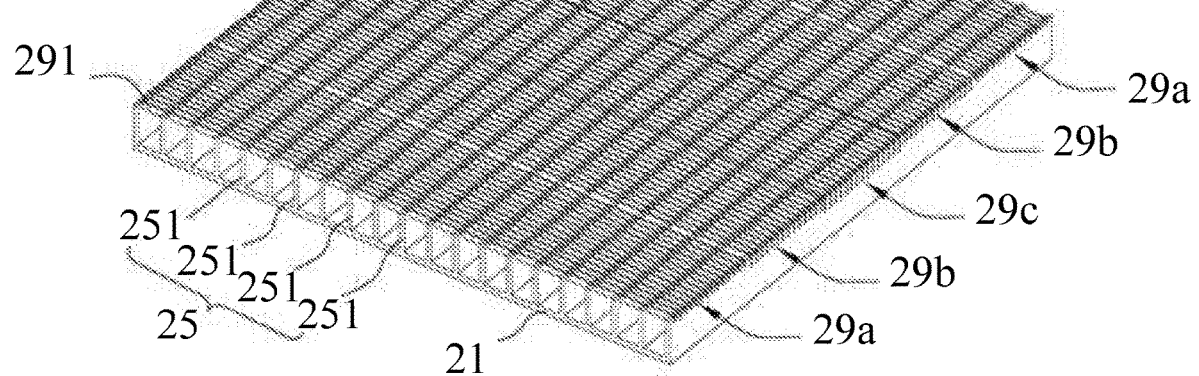
Figure 3:
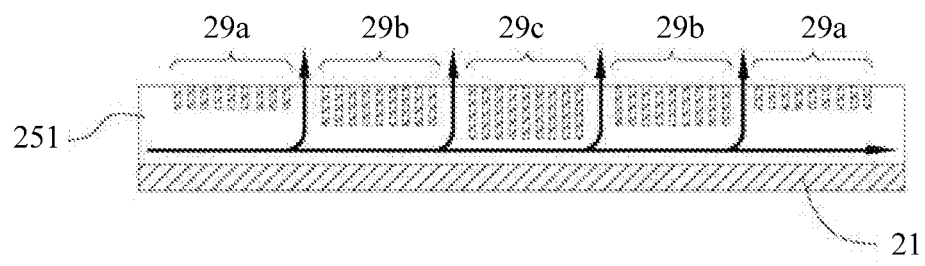
FIG. 3 is a schematic diagram of an air flow direction in a process in which the heat dissipation apparatus shown in FIG. 2 is used.

Referring to FIG. 2 and FIG. 3, a first implementation manner of the present disclosure provides a heat dissipation apparatus 20 configured to connect to various components whose heat is to be dissipated, and dissipate or reduce heat of the components whose heat is to be dissipated. The heat dissipation apparatus 20 includes a base plate 21, a guide fin group 25, and a heat dissipation fin group 29.

In this embodiment, the base plate 21 is rectangular. The guide fin group 25 is formed on a surface of the base plate 21. The base plate 21 and the guide fin group 25 are made of a metal. It is understandable that the heat dissipation apparatus 20 may also be made of another material that provides a good heat dissipation effect and good thermal conductivity.

The guide fin group 25 includes at least two guide fins 251. In this embodiment, the guide fins 251 are flaky and protrude against the base plate 21. Two adjacent guide fins 251 are disposed with an interval in order to form a guide path that helps an airflow to pass through.

Further, the heat dissipation apparatus 20 of the present disclosure is disposed with at least two heat dissipation fin groups 29, and each heat dissipation fin group 29 includes at least one heat dissipation fin 291.

A gap is disposed between the base plate 21 and lower side edges of heat dissipation fins 291 in the heat dissipation fin group 29. The base plate 21, two adjacently-disposed guide fins 251, and heat dissipation fins 291 embedded in the two guide fins 251 together constitute a flow path for flowing of an airflow.

Further, in the multiple heat dissipation fin groups 29, a gap between the base plate 21 and heat dissipation fins 291 in a heat dissipation fin group 29 that is disposed relatively near an edge of the base plate 21 is greater than a gap between the base plate 21 and heat dissipation fins 291 in a heat dissipation fin group 29 that is disposed relatively near the center of the base plate 21.

In this embodiment, the heat dissipation apparatus 20 is disposed with five heat dissipation fin groups 29. All the heat dissipation fin groups 29 are approximately perpendicular to and fastened to the top of the guide fins 251, and are sequentially arranged in an extension direction of the guide fins 251. It is understandable that a quantity of provided heat dissipation fin groups 29 and a quantity of heat dissipation fins 291 provided in each heat dissipation fin group 29 may be adjusted as required, which is not elaborated herein.

Further, in this embodiment, the heat dissipation fin groups 29 of the heat dissipation apparatus 20 include a first heat dissipation fin group 29a that is disposed near a side edge of the base plate 21, a third heat dissipation fin group 29c that is disposed in the middle of the base plate 21, and a second heat dissipation fin group 29b that is disposed between the first heat dissipation fin group 29a and the third heat dissipation fin group 29c. Among the three heat dissipation fin groups 29, a gap between the first heat dissipation fin group 29a and the base plate 21 is the greatest, and a gap between the third heat dissipation fin group 29c and the base plate 21 is the smallest. Therefore, a cross-sectional area of a flow path formed by the first heat dissipation fin group 29a is the greatest, while a cross-sectional area of a flow path formed by the third heat dissipation fin group 29c is the smallest.

As shown in FIG. 3, when an airflow A flows from outside the base plate 21 along a flow path between any two adjacent guide fins 251, the airflow A flows through all the heat dissipation fin groups 29. In a process in which the airflow flows to the middle of the base plate, because a cross-sectional area of the flow path gradually decreases, in a case in which a volume of the airflow remains unchanged, a flow rate of the airflow A increases with the decrease of the cross-sectional area. As a result, the flow rate of the airflow A is relatively high in a central region, of the base plate 21, that has a relatively high temperature, which helps improve a heat dissipation effect of a region, of the base plate 21, that has a relatively high temperature.

It is understandable that the gap between the heat dissipation fin group 29 and the base plate 21 may be changed by adjusting depth that the heat dissipation fin group 29 is embedded in the guide fins 251 and by adjusting a width of the heat dissipation fin group 29, which is not further elaborated herein.

Figure 4:
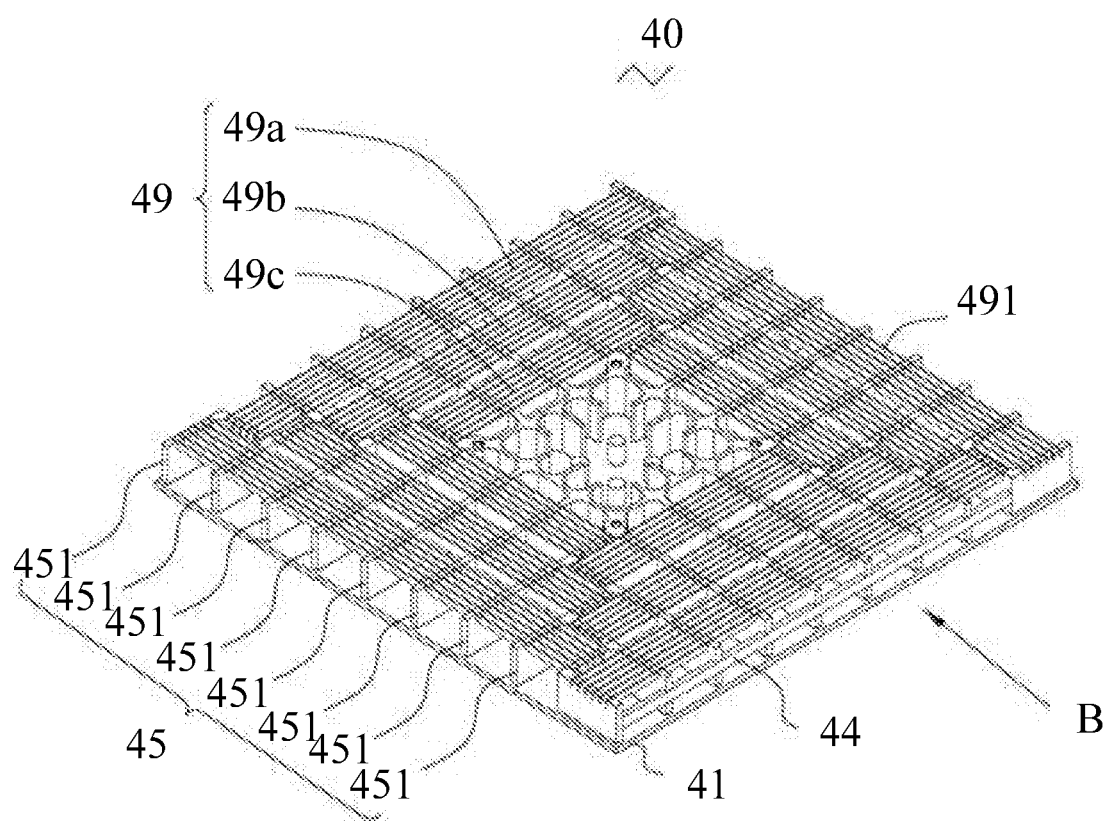
FIG. 4 is a schematic structural diagram of a heat dissipation apparatus according to Embodiment 2 of the present disclosure.

FIG. 4 shows Embodiment 2 of the present disclosure. This embodiment is approximately the same as Embodiment 1. A heat dissipation apparatus 40 in this embodiment includes a base plate 41, a guide fin group 45 that is formed on a surface of the base plate 41, and a heat dissipation fin group 49 disposed above the guide fin group 45. The guide fin group 45 includes at least two guide fins 451, and the heat dissipation fin group 49 includes at least one heat dissipation fin 491.

A difference lies in that the heat dissipation apparatus 40 is further disposed with a stopper fin 43. The stopper fin 43 is enclosed to form an enclosure. The stopper fin 43 is disposed at the center of the base plate 41 and protrudes against the surface of the base plate 41. The guide fins 451 of the guide fin group 45 extend toward the stopper fin 43 in order to implement a guide function. The stopper fin 43 is configured to stop an airflow in order to prevent the airflow from flowing and accumulating inside a stopper region enclosed by the stopper fin 43.

The heat dissipation apparatus 40 is further disposed with a heat dissipation tooth 47. The heat dissipation tooth 47 is disposed inside the stopper fin 43 and protrudes against the stopper fin 43. The heat dissipation tooth 47 is configured to enhance a heat dissipation effect of the region enclosed by the stopper fin 43.

It is understandable that the stopper fin 43 is disposed at the center of the base plate 41 means that the stopper fin 43 is disposed at the center of the base plate 41 relative to the guide fin group 45, that is, the guide fin group 45 is disposed outside the stopper fin 43. In this embodiment, the center of the base plate 41 may refer to a geometric center of the base plate 41, or a central region that is located in the middle of the base plate 41 and that covers a geometric center of the base plate 41. It is understandable that a specific location of the stopper fin 43 may also deviate from the geometric center of the base plate 41. An area enclosed by the stopper fin 43 may be adjusted according to an area of the base plate 41.

In this embodiment, an outline of the stopper fin 43 is consistent with an outline of the base plate 41, and the enclosed region formed through enclosure by the stopper fin 43 is rectangular. It is understandable that the stopper fin 43 may also be arranged to a circle, a polygon, or another shape.

In this embodiment, the heat dissipation apparatus 40 is disposed with four guide fin groups 45, and each guide fin group 45 includes multiple guide fins 451 that are parallel to each other. It is understandable that there may be only one guide fin group 45 disposed in order to implement a flow guiding effect in a specific direction. The heat dissipation apparatus 40 may also be disposed with two or more than two guide fin groups 45. The guide fin groups 45 are evenly distributed outside the stopper fin 43 and form independent guide regions in respective extension directions respectively in order to guide airflows from different directions toward the stopper region enclosed by the stopper fin 43. In all the guide fin groups 45, except that the respective extension directions are different, quantities, spacings, and shapes of the guide fins 451 provided in the guide fin groups 45 may be the same.

Further, as shown in FIG. 4, the base plate 41 is rectangular and has four side edges, and correspondingly, the heat dissipation apparatus 40 may be disposed with four guide fin groups 45 that respectively extend from the four side edges of the base plate 41 to the stopper fin 43. It is understandable that the base plate 41 may be arranged to a triangle, a circle, a polygon, or another shape, and correspondingly, multiple guide fin groups 45 may be provided, and a specific arrangement of the guide fin groups 45 is not described herein.

All guide fins 451 in all guide fin groups 45 may be parallel to each other, or may be arranged in a wavy, curvy, or radial shape, as long as that a gap for an airflow to flow through is provided between two adjacent guide fins 451.

In this embodiment, the guide fins 451 extend toward the stopper fin 43 from an edge of the base plate 41. In a process in which the heat dissipation apparatus 40 is used, an airflow formed when air flows may flow between adjacent guide fins 451 from the edge of the heat dissipation plate toward a frame that is formed by the enclosure teeth through enclosure. Thereby, an airflow with a relatively low temperature flows from the edge of the base plate 41 to the center of the base plate 41, and further heat of the base plate 41 is dissipated by means of air convection.

In this embodiment, the base plate 41 is rectangular, the stopper fin 43 is also rectangular, and side edges of the base plate 41 are approximately parallel to the enclosure teeth that form the stopper fin 43 through enclosure.

Further, each guide fin group 45 is disposed with at least two guide fins 451 that extend from one side edge of the base plate 41 and press against the outer side of the stopper fin 43. Therefore, it is ensured that an airflow can flow along a gap between the two guide fins 451 to the stopper fin 43, thereby implementing convection cooling for the stopper fin 43.

In this embodiment, side edges of the stopper fin 43 and side edges of the base plate 41 are disposed in a one-to-one correspondence. A length of a side edge of the stopper fin 43 is less than that of a corresponding side edge of the base plate 41. Therefore, in this embodiment, in multiple parallel guide fins 451 in each group of guide fins 451, a guide fin 451 located in the middle extends from the edge of the base plate 41 and presses against the outer side of the stopper fin 43, in the multiple parallel guide fins 451, guide fins 451 located at two sides perpendicularly press against a neighboring group of guide fins 451.

Figure 5:
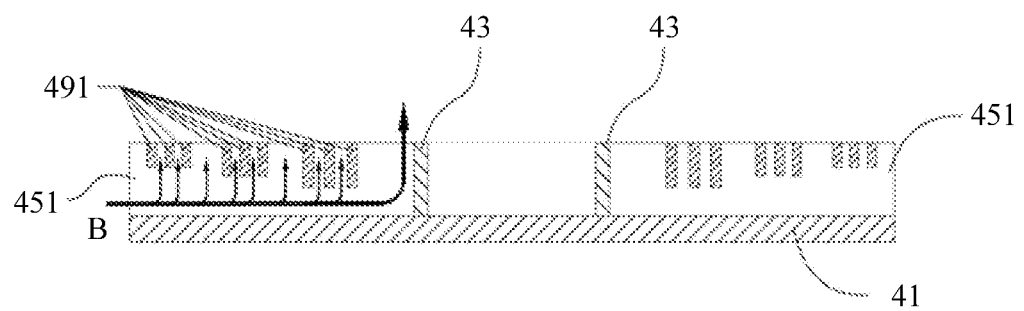
FIG. 5 is a schematic diagram of an air flow direction in a process in which the heat dissipation apparatus shown in FIG. 4 is used.

As shown in FIG. 5, when the heat dissipation apparatus 40 of this embodiment is used, heat from the stopper fin 43 may be transferred to the edge of the base plate 41 using the guide fins 451 and be dissipated. When an airflow B flows through the heat dissipation apparatus 40, the airflow B may flow above the base plate 41 in a direction parallel to the base plate 41 under the guide of the guide fins 451 in order to enhance a convection heat exchange effect when air flows. When the airflow B further flows to the stopper fin 43, the airflow B moves in a direction perpendicular to the base plate 41 and in a direction leaving the base plate 41 due to blocking of the stopper fin 43 in order to prevent the hot air from accumulating in a position, at the center of the base plate 41, in which the stopper fin 43 is disposed.

The heat dissipation apparatus 40 in this embodiment can control a flow direction of an airflow that flows through the heat dissipation apparatus 40 in order to make an airflow with a relatively low temperature at an edge of the heat dissipation apparatus 40 flow to the center of the base plate 41 and prevent the airflow from accumulating in the middle of the base plate 41, thereby ensuring that the heat dissipation apparatus 40 has a good convection heat exchange capability and provides a good heat dissipation effect.

Further, the heat dissipation apparatus 40 of the present disclosure is disposed with one or more guide fin groups 45. At least two heat dissipation fin groups 49 are provided corresponding to each group of guide fins 451, and each heat dissipation fin group 49 includes at least one heat dissipation fin 491. In this embodiment, the heat dissipation apparatus 40 is disposed with four guide fin groups 45, and three heat dissipation fin groups 49 are sequentially embedded in each guide fin group 45 in an extension direction of guide fins 451 provided in the guide fin group 45. It is understandable that a quantity of provided heat dissipation fin groups 49 and a quantity of heat dissipation fins 491 provided in each heat dissipation fin group 49 may be adjusted as required, which is not elaborated herein.

As shown in FIG. 5, similar to Embodiment 1, a gap is disposed between the base plate 41 and lower side edges of heat dissipation fins 491 in the heat dissipation fin group 49. The base plate 41, two adjacently-disposed guide fins 451, and heat dissipation fins 491 embedded in the two guide fins 451 together constitute a flow path for flowing of an airflow.

Further, as shown in FIG. 4 and FIG. 5, in multiple heat dissipation fin groups 49 provided corresponding to each guide fin group, a gap between the base plate 41 and heat dissipation fins 491 in a heat dissipation fin group 49 that is disposed relatively near the edge of the base plate 41 is greater than a gap between the base plate 41 and heat dissipation fins 491 in a heat dissipation fin group 49 that is disposed relatively near the center of the base plate 41.

Further, in this embodiment, the heat dissipation fin groups 49 of the heat dissipation apparatus 40 include a first heat dissipation fin group 49a that is disposed near a side edge of the base plate 41, a third heat dissipation fin group 49c that is disposed near the stopper fin 43, and a second heat dissipation fin group 49b that is disposed between the first heat dissipation fin group 49a and the third heat dissipation fin group 49c.

Among the three heat dissipation fin groups 49, a gap between the first heat dissipation fin group 49a and the base plate 41 is the greatest, and a gap between the third heat dissipation fin group 49c and the base plate 41 is the smallest. Therefore, a cross-sectional area of a flow path formed by the first heat dissipation fin group 49a is the greatest, while a cross-sectional area of a flow path formed by the third heat dissipation fin group 49c is the smallest.

It is understandable that the gap between the heat dissipation fin group 49 and the base plate 41 may be changed by adjusting depth that the heat dissipation fin group 49 is embedded in the guide fins 451 and by adjusting a width of the heat dissipation fin group 49, which is not further elaborated herein.

As shown in FIG. 5, when an airflow B flows from outside the base plate 41 along a flow path between any two adjacent guide fins 451 to a central region of the base plate 41, the airflow B passes through all the heat dissipation fin groups 49. In a process in which the airflow flows, because a cross-sectional area of the flow path gradually decreases, in a case in which a volume of the airflow remains unchanged, a flow rate of the airflow B increases with the decrease of the cross-sectional area. As a result, the flow rate of the airflow B is relatively high in a central region, of the base plate 41, that has a relatively high temperature, which helps improve a heat dissipation effect of the region, of the base plate 41, that has a relatively high temperature.

As shown in FIG. 4, the heat dissipation apparatus 40 is further disposed with a heat dissipation strip 44. The heat dissipation strip 44 is embedded in outer side edges of the guide fins 451 in order to enhance a heat dissipation effect of the side edges of the guide fins 451. It is understandable that the heat dissipation strip 44 may be fixedly disposed at side edges of guide fins 451 of any one or more guide fin groups 45 in any applicable manner.

Figure 6:
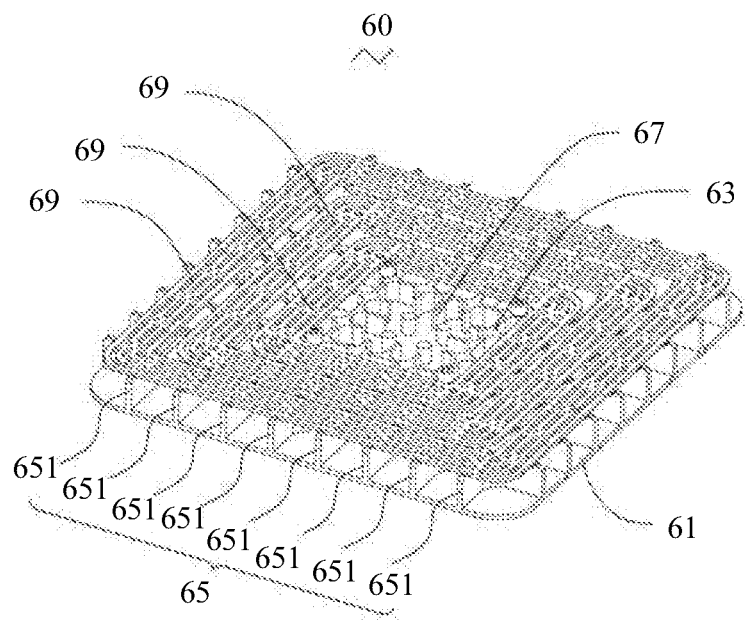
FIG. 6 is a schematic structural diagram of a heat dissipation apparatus according to Embodiment 3 of the present disclosure.

FIG. 6 shows Embodiment 3 of the present disclosure. This embodiment is approximately the same as Embodiment 1. A heat dissipation apparatus 60 in this embodiment includes a base plate 61, a stopper fin 63 that is formed on a surface of the base plate 61, a guide fin group 65, and a heat dissipation tooth 67. The guide fin group 65 includes at least one guide fin 651.

A difference lies in that the heat dissipation apparatus 60 is further disposed with a cover 69, where the cover 69 is fixedly disposed above the guide fins 651. The cover 69 is approximately parallel to the base plate 61. Further, the cover 69 is disposed with a through hole to help flowing of an airflow.

In this embodiment, each guide fin group 65 is disposed with three frame-like covers 69. A gap is also provided between the cover 69 and the base plate 61 such that the cover 69, the base plate 61, and two adjacent guide fins 651 together constitute a flow path for flowing of an airflow. It is understandable that each guide fin group 65 may also be disposed with two or more than two covers 69.

Figure 7:
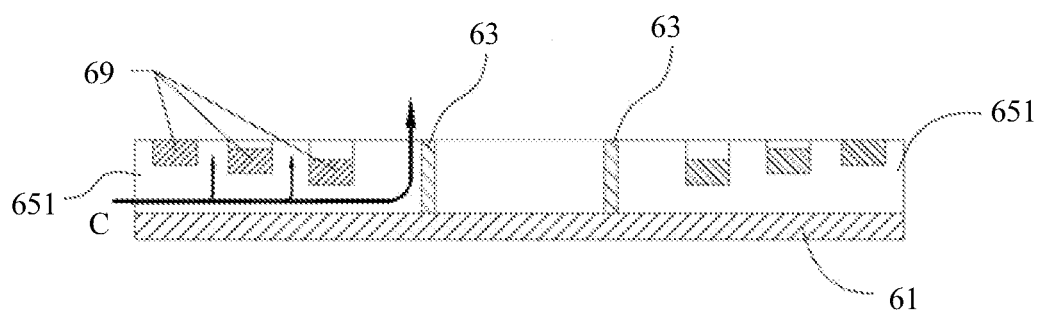
FIG. 7 is a schematic diagram of an air flow direction in a process in which the heat dissipation apparatus shown in FIG. 6 is used.

As shown in FIG. 7, similar to Embodiment 2, a gap between the base plate 61 and a cover 69 that is disposed relatively near an edge of the base plate 61 is relatively large, and a gap between the base plate 61 and a cover 69 that is disposed near the center of the base plate 61 is relatively small. Therefore, a cross-sectional area of a flow path formed between a same pair of adjacent guide fins 651 decreases gradually in a direction from the edge of the base plate 61 to the center of the base plate 61. Further, in a process in which an airflow C flows, a flow rate of the airflow C increases with the decrease of the cross-sectional area. As a result, a flow rate of the airflow C is relatively high in a central region, of the base plate 61, that has a relatively high temperature, which helps improve a heat dissipation effect of the region, of the base plate 61, that has a relatively high temperature.

The cover 69 and the base plate 61 may be interconnected in any use manner, and the gap between the cover 69 and the base plate 61 may be adjusted in any manner. Further, the guide fin 651 is disposed with a slot (not shown in the figure) configured to hold and fasten the cover 69. A slot disposed near an edge of the base plate 61 is relatively shallow, and therefore a gap between the base plate 61 and a corresponding cover 69 is relatively large. A slot disposed near the center of the base plate 61 is relatively deep, and therefore a gap between the base plate 61 and a corresponding cover 69 is relatively small.

According to the heat dissipation apparatus of the present disclosure, guide fins and a stopper fin are provided in order to control an airflow direction when air flows, and further to prevent air with a relatively high temperature from accumulating in a central position of a base plate. In addition, a heat dissipation tooth is disposed at the center of the stopper fin in order to improve an overall heat dissipation effect of the heat dissipation apparatus.

Disclosed above is merely an embodiment of the present disclosure, which certainly cannot be used to define the scope of the present disclosure. Persons of an ordinary skill in the art can understand some or all processes for implementing the foregoing embodiment, and equivalent variations made according to the claims of the present disclosure still fall in the scope covered by the present disclosure.

What is claimed is:

1. A heat dissipation fins extend apparatus, comprising:
   a base plate;
   a guide fin group formed on a surface of the base plate, wherein the guide fin group comprises two guide fins oriented parallel to each other to form a channel between the two guide fins, wherein each of the two guide fins extends along the surface of the base plate from an edge of the base plate such that the each of the two guide fins comprise a longitudinal axis that is parallel to the base plate, and wherein the two guide fins provide a flow path in the channel for an airflow;
   a heat dissipation fin group comprising a plurality of heat dissipation fins connected to the two guide fins so as to dissipate heat from the two guide fins, wherein each of the plurality of heat dissipation across the two guide fins and is disposed downward towards the base plate to form an air gap such that the each of the plurality of heat dissipation fins is disposed in the flow path between the two guide fins; and
   a stopper fin disposed on the surface of the base plate, wherein the stopper fin comprises a circumferential edge circumscribing a stopper region at a center of the base plate, and wherein the stopper region is surrounded by the guide fin group around the circumferential edge.

2. The heat dissipation apparatus of claim 1, wherein the stopper fin extends between a top circumferential edge and a bottom circumferential edge, wherein each of the top and the bottom circumferential edges circumscribe the stopper region, wherein the bottom circumferential edge is coupled to the surface of the base plate, wherein the stopper fin is configured to prevent the airflow from flowing into the stopper region, wherein the stopper region is circumscribed by the stopper fin, and wherein the two guide fins are disposed outside the stopper fin and extend from the edge of the base plate toward the stopper fin.

3. The heat dissipation apparatus of claim 2, wherein the stopper fin further comprises a heat dissipation tooth, wherein the heat dissipation tooth is disposed inside the stopper fin and configured to enhance a heat dissipation effect of the stopper region.

4. The heat dissipation apparatus of claim 2, wherein the heat dissipation apparatus further comprises a heat dissipation strip, wherein the heat dissipation strip is disposed near the edge of the base plate and is embedded in side edges of the two guide fins to dissipate heat from the side edges of the two guide fins.

5. The heat dissipation apparatus of claim 2, wherein the guide fin group comprises a quantity of guide fin groups with two guide fins, wherein the two guide fins in each of the guide fin groups of the quantity of guide fin groups extend from the edge of the base plate and press against the stopper fin.

6. The heat dissipation apparatus of claim 5, wherein the quantity of guide fin groups is two or more, and wherein the two guide fins in the each of the guide fin groups are evenly distributed outside the stopper fin and form independent guide regions respectively.

7. The heat dissipation apparatus of claim 2, wherein the heat dissipation fin group comprises a quantity of heat dissipation fin groups, wherein the quantity of heat dissipation fin groups is at least two, and wherein all heat dissipation fin groups of the quantity of heat dissipation fin groups are sequentially arranged in an extension direction of the two guide fins.

8. A heat dissipation apparatus, comprising:
a base plate;
a guide fin group formed on a surface of the base plate, wherein the guide fin group comprises two guide fins oriented parallel to each other to form a channel between the two guide fins, wherein each of the two guide fins extends along the surface of the base plate from an edge of the base plate such that the each of the two guide fins comprise a longitudinal axis that is parallel to the base plate, and wherein the two guide fins provide a flow path in the channel for an airflow;
a heat dissipation fin group comprising a plurality of heat dissipation fins, wherein each of the plurality of heat dissipation fins is connected to a top of the two guide fins wherein the each of the plurality of heat dissipation fins extends across the two guide fins and is disposed downward towards the base plate to form an air gap such that the each of the plurality of heat dissipation fins is disposed in the flow path between the two guide fins;
a stopper fin disposed at a center of the base plate, wherein the stopper fin comprises a circumferential edge circumscribing a stopper region at the center of the base plate, and wherein the stopper region is surrounded by the guide fin group around the circumferential edge; and
a cover fixedly connected to the top of the two guide fins to dissipate heat of the two guide fins.

9. The heat dissipation apparatus of claim 8, wherein the cover is disposed with a through hole.

10. The heat dissipation apparatus of claim 8, wherein the stopper fin extends between a top circumferential edge and a bottom circumferential edge, wherein each of the top and the bottom circumferential edges circumscribe the stopper region, and wherein the bottom circumferential edge is coupled to the surface of the base plate.

11. The heat dissipation apparatus of claim 10, wherein the stopper fin is configured to prevent the airflow from flowing into the stopper region from the edge of the base plate.

12. The heat dissipation apparatus of claim 10, wherein the two guide fins are disposed outside the stopper fin and extend from the edge of the base plate toward the stopper fin.

13. The heat dissipation apparatus of claim 10, further comprising a heat dissipation tooth, wherein the heat dissipation tooth is disposed inside the stopper region and configured to enhance a heat dissipation effect of the stopper region.

14. The heat dissipation apparatus of claim 8, further comprising a heat dissipation strip, wherein the heat dissipation strip is disposed near the edge of the base plate, and wherein the heat dissipation strip is embedded in side edges of the two guide fins to dissipate heat from the side edges of the two guide fins.

15. The heat dissipation apparatus of claim 8, wherein the guide fin group comprises a quantity of guide fin groups, and wherein at least two guide fins in each guide fin group of the quantity of guide fin groups extend from the edge of the base plate and press against the stopper fin.

16. The heat dissipation apparatus of claim 15, wherein the quantity of guide fin groups is two or more, and wherein the at least two guide fins in the each of the guide fin groups are evenly distributed outside the stopper fin and form respective independent guide regions.

17. The heat dissipation apparatus of claim 8, wherein at least one heat dissipation fin of the heat dissipation fins is configured to dissipate heat of the two guide fins.

18. The heat dissipation apparatus of claim 8, wherein the heat dissipation fin group comprises a quantity of heat dissipation fin groups, wherein the quantity of heat dissipation fin groups is at least two, and wherein all heat dissipation fin groups of the quantity of heat dissipation fin groups are sequentially arranged in an extension direction of the two guide fins.

* * * * *

UNITED STATES PATENT AND TRADEMARK OFFICE
CERTIFICATE OF CORRECTION

PATENT NO. : 10,627,172 B2
APPLICATION NO. : 15/651873
DATED : April 21, 2020
INVENTOR(S) : Xia et al.

It is certified that error appears in the above-identified patent and that said Letters Patent is hereby corrected as shown below:

On the Title Page

Column 2, Line 2, under Other Publications: "Application No. 15677563.5, Extended European Search Report" should read "Application No. 15877563.5, Extended European Search Report"

Page 2, Column 2, Line 4, under Foreign Patent Documents: "JP H107254794 A 10/1995" should read "JP H07254795 A 10/1995"

Signed and Sealed this
Fifteenth Day of September, 2020

Andrei Iancu
*Director of the United States Patent and Trademark Office*